(12) United States Patent
Jain

(10) Patent No.: US 11,328,762 B2
(45) Date of Patent: May 10, 2022

(54) WRITE DRIVER BOOST CIRCUIT FOR MEMORY CELLS

(71) Applicant: Taiwan Semiconductor Manufacturing Company, Ltd., Hsinchu (TW)

(72) Inventor: Sanjeev Kumar Jain, Ottawa (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/024,759

(22) Filed: Sep. 18, 2020

(65) Prior Publication Data

US 2022/0093154 A1    Mar. 24, 2022

(51) Int. Cl.
| | |
|---|---|
| *G11C 5/14* | (2006.01) |
| *G11C 11/4074* | (2006.01) |
| *G11C 11/4094* | (2006.01) |
| *G11C 5/06* | (2006.01) |
| *G11C 5/02* | (2006.01) |
| *G11C 11/4096* | (2006.01) |

(52) U.S. Cl.
CPC ......... *G11C 11/4074* (2013.01); *G11C 5/025* (2013.01); *G11C 5/06* (2013.01); *G11C 11/4094* (2013.01); *G11C 11/4096* (2013.01)

(58) Field of Classification Search
CPC ... G11C 11/4074; G11C 5/06; G11C 11/4096; G11C 11/4094; G11C 5/025
USPC .................................................... 365/189.09
See application file for complete search history.

(56) References Cited

U.S. PATENT DOCUMENTS

| | | | |
|---|---|---|---|
| 9,865,337 B1 * | 1/2018 | Ahmed | ............... G11C 7/12 |
| 2014/0219009 A1 * | 8/2014 | Chow | ............. G11C 11/419 |
| | | | 365/154 |

\* cited by examiner

*Primary Examiner* — Huan Hoang
*Assistant Examiner* — Minh Dinh
(74) *Attorney, Agent, or Firm* — Jones Day

(57) ABSTRACT

Circuits, systems, and methods are described herein for generating a boost voltage for a write operation of a memory cell. In one embodiment, a boost circuit includes a first inverter and a second inverter, each configured to invert a write signal. The boost circuit also includes a transistor and a capacitor. The transistor is coupled to an output of the first inverter. The transistor is configured to charge a capacitor based on the write signal and provide a supply voltage to a write driver. The capacitor is coupled to an output of the second inverter. The capacitor is configured to generate and provide a delta voltage to the write driver.

20 Claims, 10 Drawing Sheets

US 11,328,762 B2

WRITE DRIVER BOOST CIRCUIT FOR MEMORY CELLS

TECHNICAL FIELD

This relates to semiconductor device design and more particularly to a write driver boost circuit for memory cells.

BACKGROUND

A memory is typically divided into logical units of storage, such as memory banks, words of memory, bytes of memory, and bits of memory. Control signals are routed to memory units to initiate operations, such as read and write operations. In order to perform read and write operations, specific voltage levels are needed.

BRIEF DESCRIPTION OF THE DRAWINGS

Aspects of the present disclosure are best understood from the following detailed description when read with the accompanying figures.

DETAILED DESCRIPTION

Figure 1:
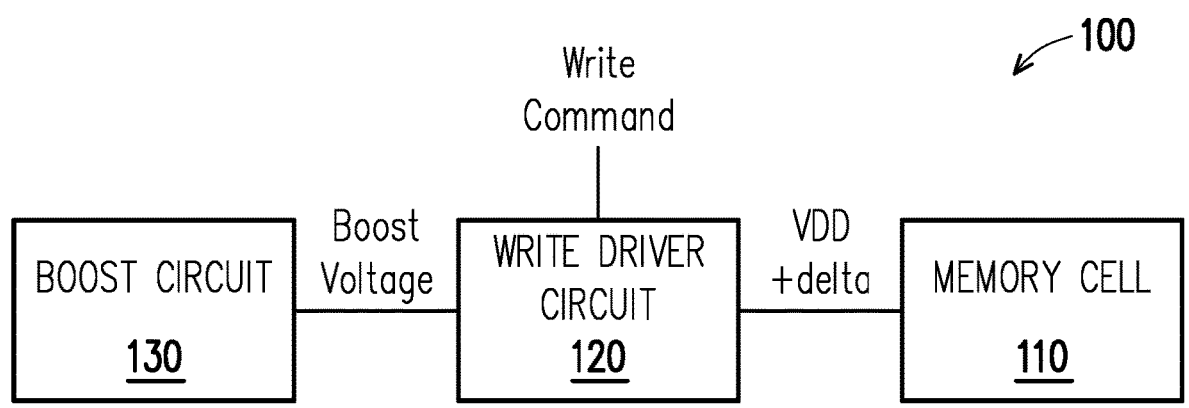
FIG. 1 illustrates an exemplary memory architecture having a memory cell, write driver, and a boost circuit in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Memory devices are typically implemented by activating/transmitting commands (e.g., word line activation commands, column read commands, word line/bit line pre-charge commands, sense amplifier pre-charge commands, sense amplifier enable commands, read driver commands, write driver commands) to memory units (e.g., memory banks), which are often implemented via multiple memory arrays (e.g., a left array and a right array of a memory bank, three memory arrays of a memory bank). Each memory array contains a plurality of memory cells, typically arranged in rows (e.g., words) and columns. Electronic signals (e.g., voltage and current) can trigger operations of the memory devices such as read and write operations. Write operations, for example, can require a minimum voltage, Vmin, in order to write data to a memory cell. That minimum voltage is provided by a write driver circuit.

FIG. 1 illustrates an exemplary memory architecture 100 having a memory cell 110, a write driver circuit 120, and a boost circuit 130 in accordance with various embodiments of the present disclosure. Memory cell 110 is used to store data. Data is stored within a memory cell 110 when it is "written" through a write operation. In order to perform the write operation, a minimum voltage, Vmin, level is needed to power electrical components of the memory cell 110. Memory cell 110 can be powered using a supply voltage, VDD. If the supply voltage, VDD, on its own is not close to or above a certain threshold level, Vmin, the write operation may not be performed as the components within the memory cell 110 may not have enough power to operate. A write driver circuit 120 can receive external write command to trigger a write operation. Upon receiving the write command, the write driver circuit 120 sends a voltage to the memory cell 110. The supply voltage, VDD, on its own may not be enough to power the components within the memory cell 110. Without sufficient power, the memory cell 110 may not be able to perform a write operation. In order to ensure that sufficient power is provided to memory cell 110, a boost circuit 130 coupled to the write driver circuit 120 can provide a boost voltage that increases the supply voltage, VDD, by a delta voltage. The delta voltage is dependent upon a capacitor value of a capacitor (e.g., capacitor 236 described in FIG. 2) within the boost circuit 130. That voltage (e.g., supply voltage, VDD, plus a delta voltage) in turn can be provided to the memory cell 110. The boost voltage enables operation of a write operation within the memory cell 110 as the electrical components within the memory cell 110 have sufficient power.

Figure 2:
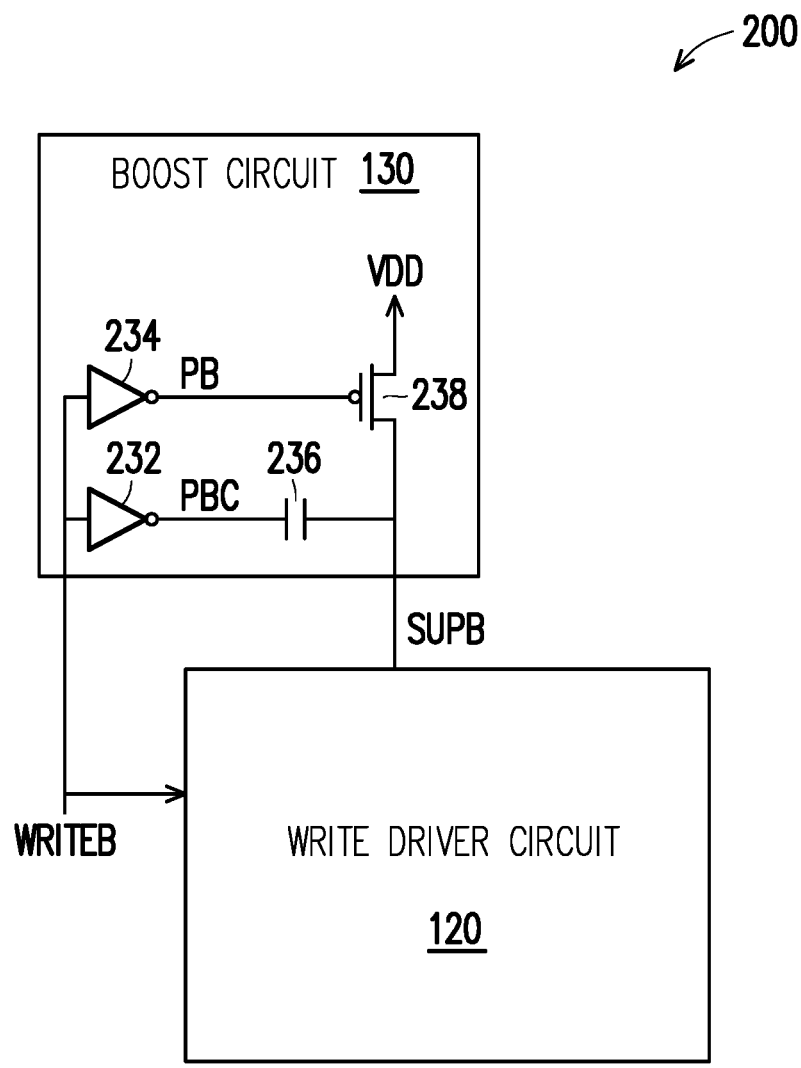
FIG. 2 illustrates an exemplary circuit having a boost circuit coupled to a write driver in accordance with various embodiments of the present disclosure.

FIG. 2 illustrates an exemplary circuit 200 having a boost circuit 130 coupled to a write driver circuit 120 in accordance with various embodiments of the present disclosure. The circuit 200 is configured to selectively provide a boost voltage for use by the memory cell 110 to perform write operations. The boost circuit 130 includes inverters 232, 234, a capacitor 236, and a transistor 238. In the embodiment illustrated in FIG. 2, transistor 238 is a PMOS transistor. A write decoder signal, WRITEB, is provided as input to inverters 232, 234. The output of inverter 234, PB, is coupled to a gate terminal of transistor 238. A source/drain terminal of transistor 238 is coupled to a supply voltage, VDD. Another source/drain terminal of transistor 238 is coupled to both the write driver circuit 120 and a terminal of capacitor 236. The other terminal of capacitor 236 is coupled to an output of inverter 232, PBC.

The write decoder signal, WRITEB, is provided as input to both the write driver circuit 120 and the boost circuit 130. The write driver circuit 120 triggers a write operation based on the write decoder signal, WRITEB, based on whether the signal is a logic high or logic low, as described in more detail in FIGS. 5-7. The write decoder signal, WRITEB, can be generated by a write decoder circuit (not shown). The boost circuit 130 uses the write decoder signal, WRITEB, to generate a boost voltage, SUPB. When the write decoder signal, WRITEB, is a logic low (e.g., '0'), the boost voltage, SUPB, level provided to write driver circuit 120 is equal to about the supply voltage, VDD, plus a delta voltage generated by capacitor 236. The voltage measured across the capacitor 236 is the delta voltage. This delta voltage across capacitor 236 can vary with time based on whether the capacitor is fully charged, dissipating a charge, or not charged. In order to generate a boost voltage that is equal to approximately the supply voltage, VDD, plus a delta voltage generated by the capacitor 236, the write decoder signal, WRITEB, is a logic low. Inverter 234 takes a logic low input of the write decoder signal, WRITEB, and generates an opposite output, PB, which is a logic high. The output of inverter 234, PB, is coupled to a gate terminal of transistor 238. When transistor 238 is a PMOS transistor, a logic high applied to the gate terminal causes transistor 238 to operate as an open switch. More specifically, a logic high provided to the gate of transistor 238 makes the gate voltage, VG, approximately equal to the supply voltage, VDD, coupled to a source/drain terminal of the transistor 238. In turn, with equal voltage between the gate voltage, VG, and the supply voltage, VDD, applied at a source of the transistor 238, the transistor 238 operates as open switch. Inverter 232 also takes the logic low input of write decoder signal, WRITEB, and generates an output, PBC, which is a logic high (e.g., a signal which is opposite the input). That output signal of inverter 232, PBC, is coupled to a terminal of capacitor 236. The other terminal of capacitor 236 is coupled to a source/drain terminal of transistor 238. With a logic high from the output of inverter 232, PBC, on one terminal of capacitor 236 and an open switch on the other end of capacitor 236, the capacitor 236 discharges or dissipates its voltage. With capacitor 236 discharging, the boost voltage, SUPB, is approximately equal to the supply voltage, VDD, plus a delta voltage which slowly declines overtime as the capacitor 236 discharges. The delta voltage generated by capacitor 236 is a function of the sizing of capacitor 236. Capacitor 236 can be sized appropriately by one of skill in the art so as to generate a sufficient delta voltage need for a given memory cell to perform a write operation.

Alternatively, when the write signal, WRITEB, is a logic high (e.g., '1'), the boost voltage, SUPB, is approximately equal to the supply voltage, VDD. In order to generate a boost voltage, SUPB, that is equal to approximately the supply voltage, VDD, the write decoder signal, WRITEB, is a logic high. With a logic high as input, both inverters 232, 234 generate an opposite signal of a logic low as output for PB, PBC, respectively. With a logic low applied to the gate terminal of transistor 238, the gate voltage is approximately zero volts and the transistor 238 operates as a closed switch. This closed switch connects the supply voltage, VDD, to a terminal of capacitor 236. On the other terminal of capacitor 236, the logic low of signal PBC is applied. In this state, the capacitor 236 is charging and it does not provide any additional voltage to write driver circuit 120. As a result, the boost voltage, SUPB, provided to write driver circuit 120 is equal to approximately the supply voltage, VDD.

Figure 3:
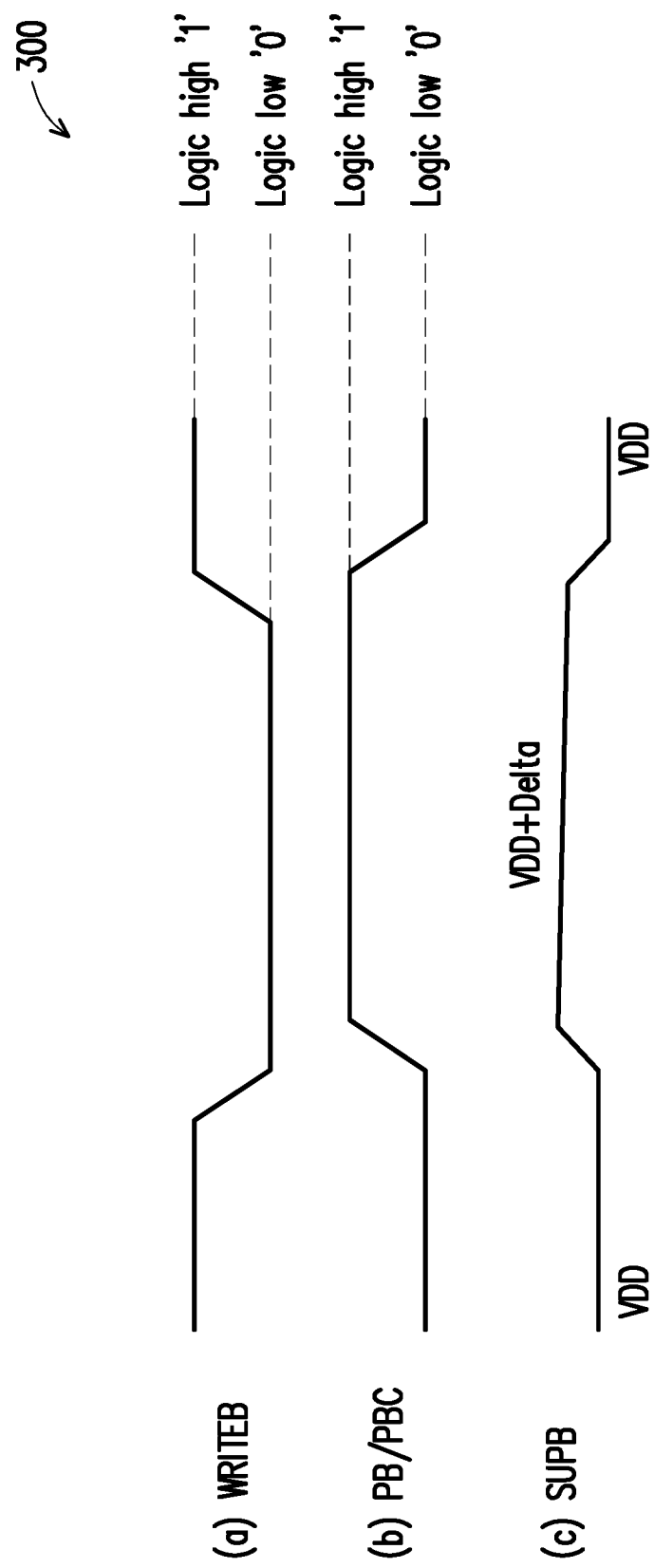
FIG. 3 illustrates an exemplary timing diagram associated with the exemplary circuit as described in FIG. 2 in accordance with various embodiments of the present disclosure.

FIG. 3 illustrates an exemplary timing diagram 300 associated with the exemplary circuit 130 as described in FIG. 2 in accordance with various embodiments of the present disclosure. Plot (a) illustrates the write decoder signal, WRITEB, that is provided as input to inverters 232, 234 and write driver circuit 120. Plot (b) illustrates the outputs of inverter 232 (e.g., PBC) and inverter 234 (e.g., PB). Plot (c) illustrates the boost voltage, SUPB, generated by boost circuit 130. By way of example and for ease of understanding, the timing diagram is described in relation to the circuitry illustrated in FIG. 2. When the write decoder signal, WRITEB, is a logic high, the output of inverter 232 (e.g., PBC) and inverter 234 (e.g., PB) are both logic lows. This combination results in a boost voltage, SUPB, that is equal to approximately to the supply voltage, VDD. Alternatively, when the write decoder signal, WRITEB, is a logic low, the output of inverters 232 PBC, 234 PB, respectively are both logic highs. This combination results in a boost voltage, SUPB, that is approximately equal to the supply voltage, VDD, plus a delta voltage (e.g., the voltage across capacitor 236 when fully charged). As illustrated in plot (c) by the negative sloping plot line, the boost voltage, SUPB, decreases over time. It is noted that the supply voltage, VDD, level remains constant over time. The decrease in voltage corresponds to the capacitor 236 charge dissipation. In other words, as time progress, the capacitor 236 loses its charge and outputs a decreasingly lower voltage level.

Figure 4:
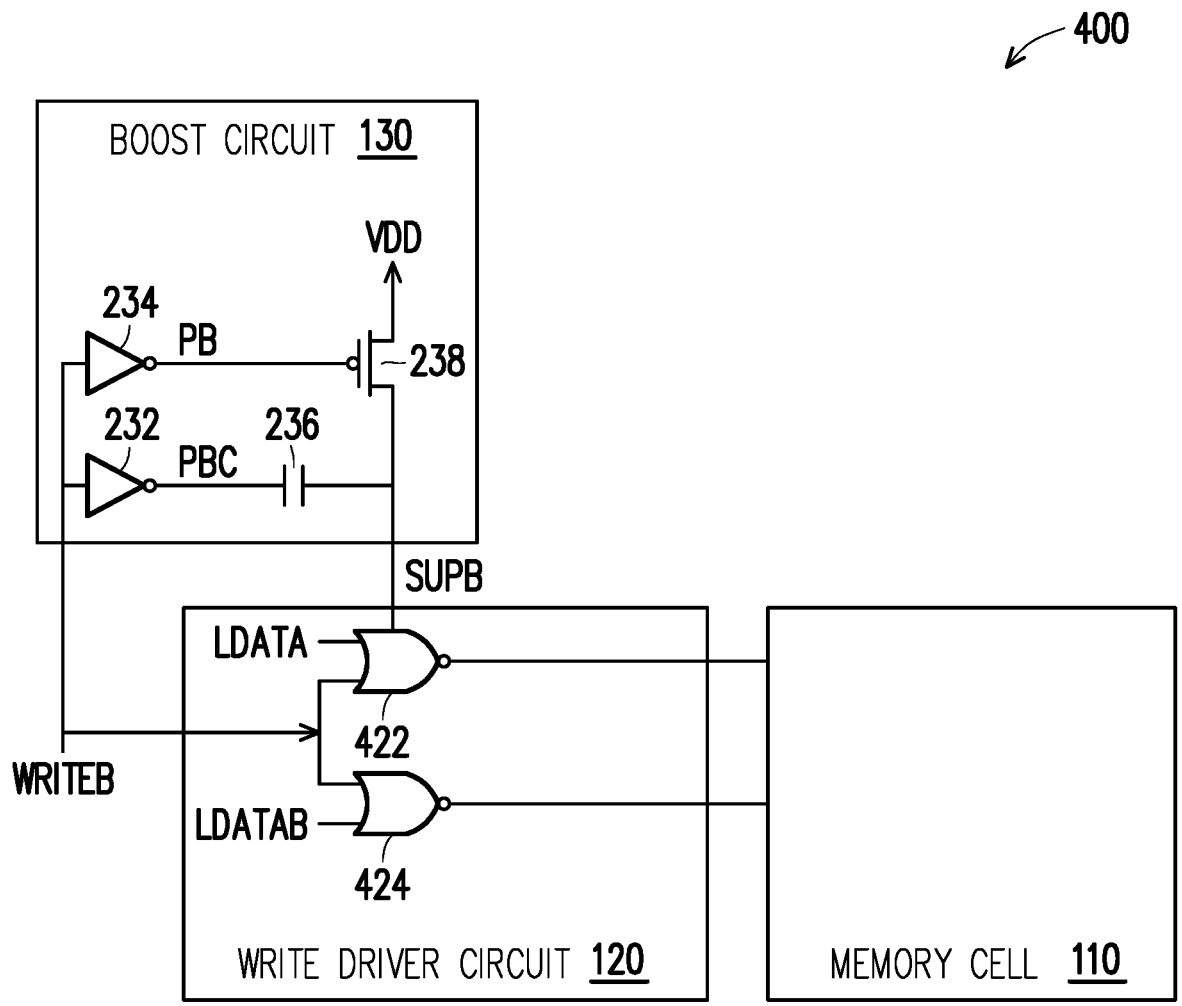
FIG. 4 illustrates an exemplary circuit having a memory cell, a write driver circuit, and a boost circuit in accordance with various embodiments of the present disclosure.

FIG. 4 illustrates an exemplary circuit 400 having a memory cell 110, a write driver circuit 120, and a boost circuit 130 in accordance with various embodiments of the present disclosure. Write driver circuit 120 includes NOR gates 422, 424. Write driver circuit 120 is coupled to the boost circuit 130 as described in detail in FIG. 2. More specifically, each NOR gate 422, 424 is driven by the boost voltage, SUPB, provided by boost circuit 130. In other words, the boost voltage, SUPB, powers each NOR gate 422, 424. When the output of either NOR gate 422, 424 is a logic high, the boost voltage, SUPB, is provided to memory cell 110. NOR gate 422 receives a latch data, LDATA, signal generated by a latch circuit (not shown) as well as the write decoder signal, WRITEB. NOR gate 424 receives an opposite latch data, LDATAB, signal also generated by a latch circuit (not shown) and the write decoder signal, WRITEB. Each NOR gate 422, 424 compares its respective inputs and outputs a logic high signal when both inputs are logic lows. For all other combinations of inputs, each NOR gate 422, 424 outputs a logic low. The outputs of each NOR gate 422, 424 is coupled to memory cell 110 and provide the boost voltage, SUPB, based on which output is a logic high. In other words, only one NOR gate 422, 424 is active at a time as the latch data signals, LDATA/LDATAB, are opposite one another. When the LDATA signal is a logic high, the LDATAB signal is a logic low, and vice versa. For example, when both the write decoder signal, WRITEB, and the data signal, LDATA, are logic lows, the NOR gate 422 provides the boost voltage, SUPB, to memory cell 110. Alternatively, when both the write decoder signal, WRITEB, and the data signal, LDATAB, are logic lows, the NOR gate 424 provides the boost voltage, SUPB, to memory cell 110. How memory cell 110 utilizes this boost voltage is described in more detail in FIG. 5.

Figure 5:
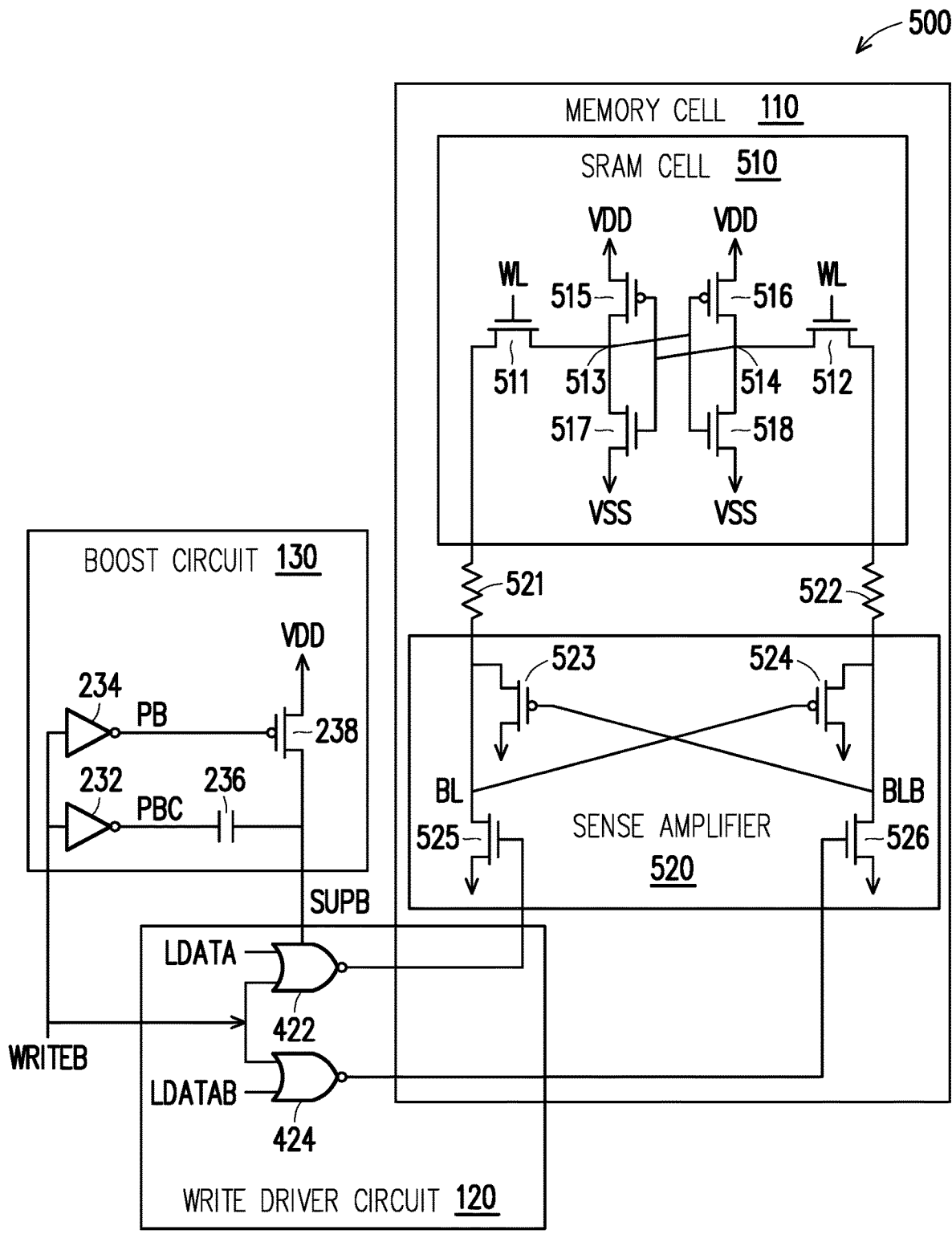
FIG. 5 illustrates an exemplary memory architecture including a memory cell, a write driver, and a boost circuit in accordance with various embodiments of the present disclosure.

FIG. 5 illustrates an exemplary memory architecture 500 including a memory cell 110, a write driver circuit 120, and a boost circuit 130 in accordance with various embodiments of the present disclosure. Boost circuit 130 can include the components and functionality as previously described in FIG. 2. Write driver circuit 120 can include the components and functionality as previously described in FIG. 4. In some embodiments, memory cell 110 includes a six transistor (6T) SRAM cell 510 and sense amplifier 520. SRAM cell 510 includes pass gate transistors 511, 512, pull up transistors 515, 516, and pull down transistors 517, 518. A pair of MOS pass gates 511, 512 couple a pair bit lines BL and BLB to the data nodes 513, 514, respectively. The pass gate transistors 511, 513 are formed of MOS transistors arranged as transfer gates. In this embodiment, the transistors 511, 512 are implemented as NMOS transistors. The supply voltage, VDD, couples to a source/drain terminal of each of pull up transistors 515, 516. In this embodiment, the pull up transistors 515, 516 are PMOS transistors.

A second supply voltage, VSS, usually placed at ground, couples to data nodes 513, 514 via pull down transistors 517, 518. Pull down transistors 517, 518 in this embodiment are NMOS transistors. Pull down transistors 517, 518 couple the second supply voltage, VSS, to one or the other storage nodes 513, 514, depending on the state of data stored in the 6T SRAM cell 510. The 6T SRAM cell 510 is a latch that retains its data state indefinitely, so long as the supplied power is sufficient to operate the circuit correctly. In other words, a minimum voltage level, Vmin, must be maintained.

Two CMOS inverters, one formed of transistors 515, 517 and one formed of 516, 518, respectively, are "cross coupled" and they operate to reinforce the stored charge on the storage nodes 513, 514 continuously. The two storage nodes 513, 514 are inverted one from the other. When data node 513 is a logical high, data node 514 is at the same time a logical low, usually a low voltage, and vice versa.

When the 6T SRAM cell 510 is written to, complementary write data signals are placed on the bit line pair BL and BLB. A positive control signal on a word line WL is coupled to the gate of both pass gates 511, 512. The transistors 515, 516, 517, 518 and the pass gates 511, 512 are sized such that the write data on the bit lines may overwrite the stored data at data nodes 513, 514, and thus write the 6T SRAM cell 510 to a desired state. When the 6T SRAM cell 510 is read from, a positive voltage is placed on the word line WL, and the pass gates 511, 512 allow the bit lines BL and BLB to be coupled to, and receive the data from, the storage nodes 513, 514. The bit lines BL and BLB form a complementary pair of data lines.

Sense amplifier 520 acts as a switch for which bit line (BL or BLB) to write to. Sense amplifier 520 includes transistors 523, 524, 525, 526. In this embodiment, transistors 523, 524 are PMOS transistors and transistors 525, 526 are NMOS transistors. The gate terminal of transistor 523 is cross-coupled to a source/drain terminal of transistor 526. Similarly, the gate terminal of transistor 524 is cross-coupled to a source/drain terminal of transistor 525. Resistors 521, 522 of sense amplifier 520 are each coupled to a source/drain terminal of pass gate transistors 511, 512, respectively. The gate terminals of transistors 525, 526 are driven by the outputs of NOR gates 422, 424 of write driver circuit 120. When the output of either NOR gate 422, 424 is a logic high '1', the voltage supplied to either transistor 525, 526 is the boost voltage, SUPB.

A bit line resistance is inherent between the SRAM cell 510 and sense amplifier 520. For ease of understanding, this bit line resistance is represented as resistors 521, 522. Because of the presence of the bit line resistance, a voltage greater than the supply voltage, VDD, may be needed to perform a write operation within SRAM cell 510. This additional voltage (e.g., VDD+delta voltage across capacitor 236) can be provided by the boost voltage, SUPB, when the voltage is equal to approximately the supply voltage, VDD, plus the delta voltage generated by capacitor 236 (e.g., the voltage measured across the capacitor 236). The boost voltage, SUPB, drives the NOR gates 422, 424 within write driver circuit 120 by providing power to each of the NOR gates 422, 424. When the output of either NOR gate 422, 424 is a logic high (e.g., '1'), the voltage level output by the respective NOR gate 422, 424 is equal to the boost voltage, SUPB. Write driver circuit 120 determines which bit line to write to (e.g., either BL or BLB), which is the input sense amplifier 520 of memory cell 110. Sense amplifier 520 acts as a switch for which bit line (BL or BLB) to write to and drives operation of SRAM cell 510.

Figure 6:
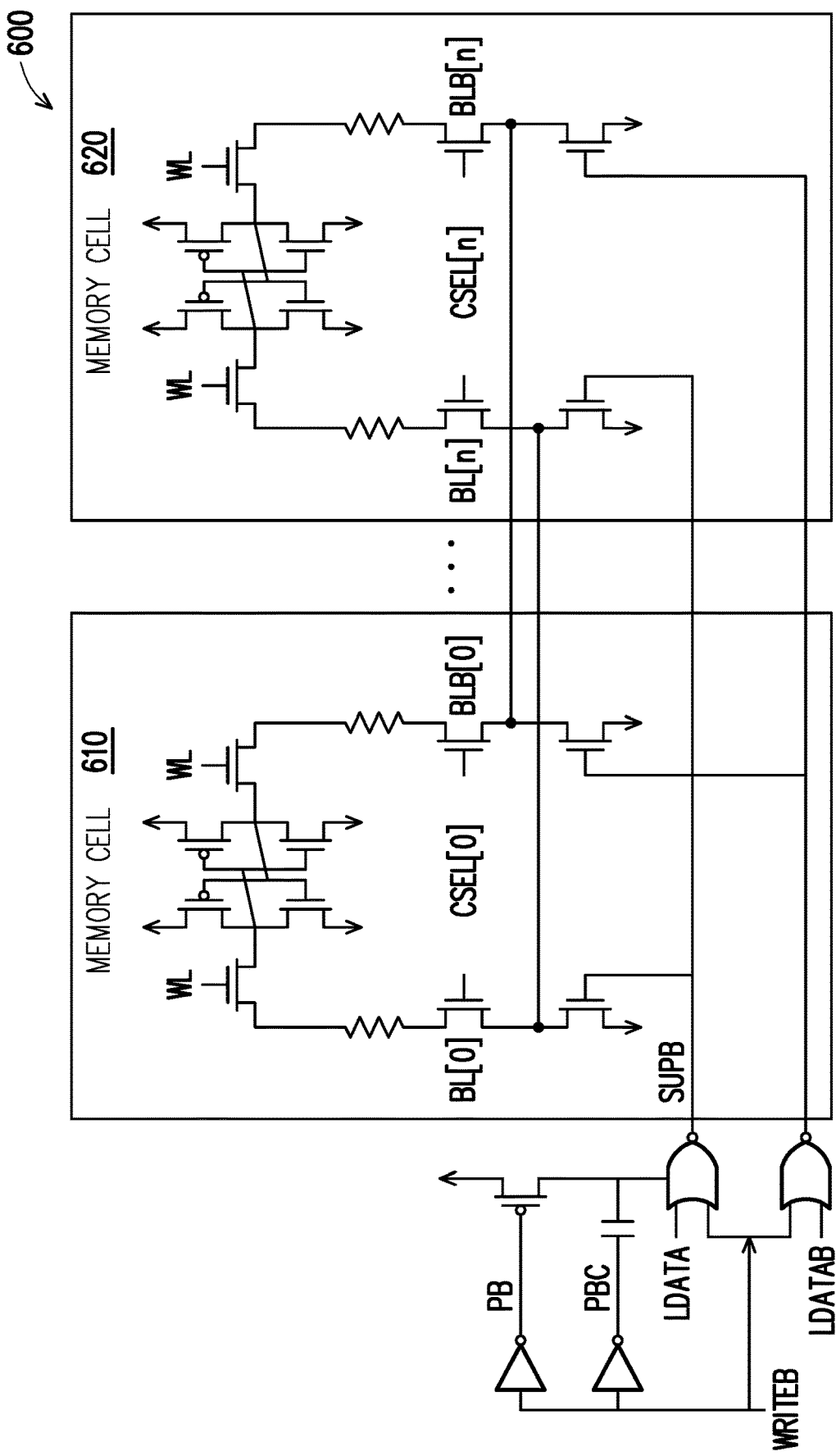
FIG. 6 illustrates another exemplary memory architecture having multiple stages of memory cells in accordance with various embodiments of the present disclosure.

FIG. 6 illustrates another exemplary memory architecture 600 having multiple stages of memory cells 610, 620 in accordance with various embodiments of the present disclosure. Each memory cell can correspond to a column within a memory architecture 600. Although two memory cells 610, 620 are illustrated in FIG. 6, one of skill in the art can appreciate that any number of memory cells (e.g., n number of memory cells) can be coupled together. Each memory cell 610, 620 can be coupled to each other via the bit line pairs (BL/BLB). For example, the bit line BL[0] of memory cell 610 is coupled to the bit line BL[n] of memory cell 620. Similarly, the bit line BLB[0] of memory cell 610 is coupled to the bit line BLB[n] of memory cell 620. The output of write driver circuit 120 (e.g., output of NOR gate 422 is coupled to the gate of NMOS transistor 525 and output of NOR gate 424 is coupled to the gate of NMOS transistor 526) is coupled to the bit lines of memory cells 610, 620. The boost voltage, SUPB, drives the NOR gates 422, 424 within write driver circuit 120 by providing power to each of the NOR gates 422, 424. When the output of either NOR gate 422, 424 is a logic high (e.g., '1'), the voltage level output by the respective NOR gate 422, 424 is equal to the boost voltage, SUPB. The boost voltage, SUPB, is provided to both memory cells 610, 620 based on the output of either NOR gate 422, 424 being a logic high (e.g., '1'). The boost voltage, SUPB, facilitates delivery of a sufficient voltage for write operations to be performed by the memory cells 610, 620. When boost circuit 130 is providing a boost voltage to a number of memory cells, the capacitor 236 should be sized appropriately as the voltage across capacitor 236 is the delta voltage. The delta voltage needed to drive the write driver circuit 120 is based upon the bit line resistance.

Figure 7:
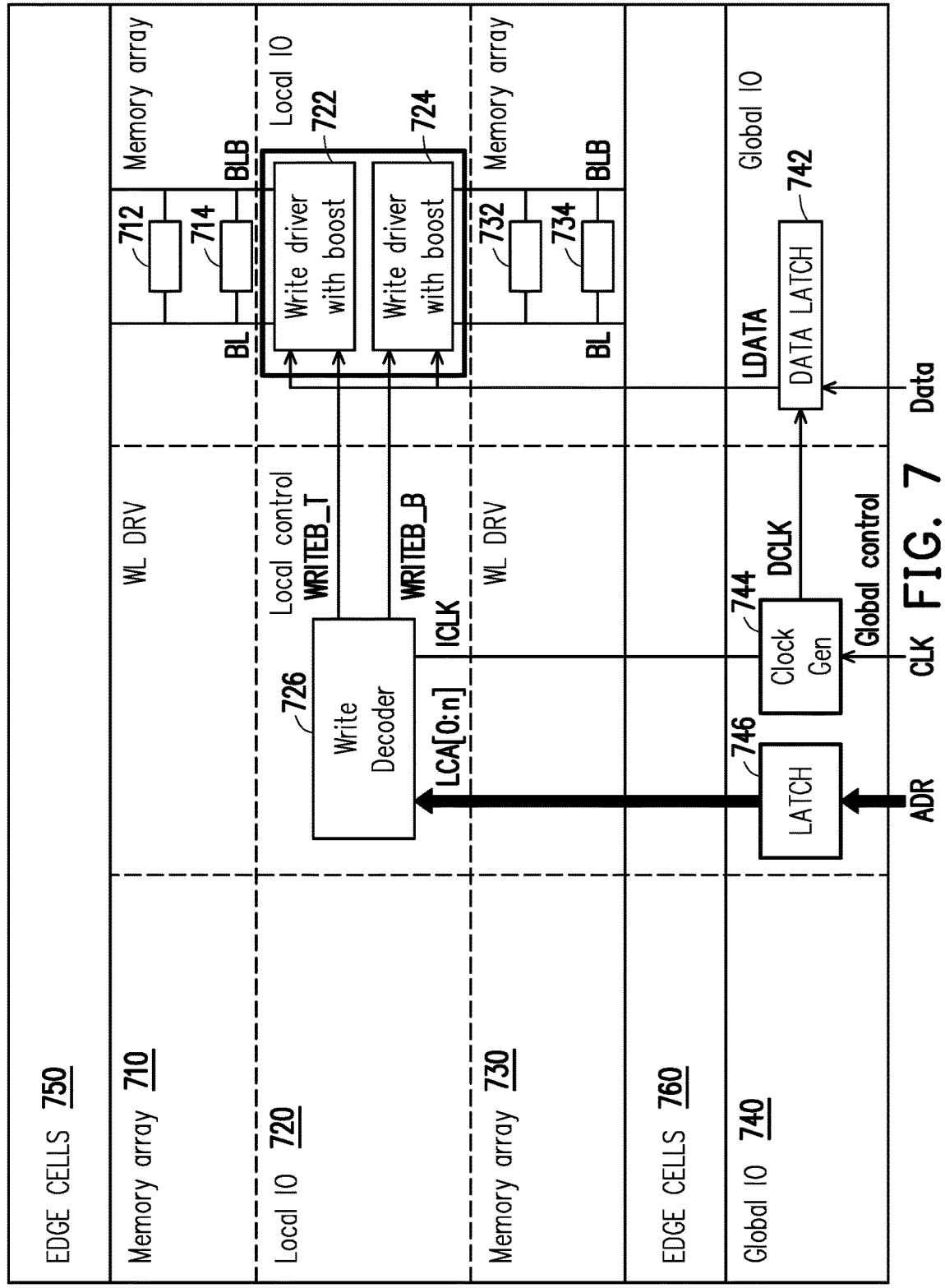
FIG. 7 illustrates another exemplary memory architecture having boost circuits in local input/output in accordance with various embodiments of the present disclosure.

FIG. 7 illustrates another exemplary memory architecture 700 having boost circuits within a local input/output (I/O) in accordance with various embodiments of the present disclosure. Memory architecture 700 includes a number of circuits oriented for ease of understanding in groupings such as memory arrays 710, 730, local I/O 720, global I/O 740, and edge cells 750, 760. The global I/O 740 includes a data latch circuit 742, a clock generator circuit 744, and a latch circuit 746. The global I/O 740 receives an external clock signal, CLK, address inputs, ADR, and data for writing into a memory cell. The address inputs, ADR, are processed by a latch circuit 746. The latch circuit 746 generates a latched column address, LCA, where n represents a column number. A clock generator 744 receives the external clock signal and generates clock signals for the data latch circuit 742 (e.g., DCLK) and for write decoder 726 (e.g., ICLK). The data latch circuit 742 receives data for writing into memory. The data latch circuit 742 generates the LDATA signal to drive one or more write driver circuits 722, 724. These write driver circuits 722, 724 are coupled to the boost circuits as previously described in FIGS. 1-2 and FIGS. 4-6. The write decoder 726 generates the write driver signal, WRITEB, which is used by write drivers 722, 724 to determine which bit line (e.g., BL or BLB) is provided with the boost voltage, SUPB, based on the output of the NOR gates 422, 424 being a logic high (e.g., '1'). The boost voltage, SUPB, for memory cells 712, 714 is delivered from write driver 722 such that the voltage is delivered to memory cells 712, 714 from the bottom. In other words, the boost voltage, SUPB, is delivered to memory cell 714 before memory cell 712. The boost voltage, SUPB, for memory cells 732, 734 is delivered from write driver 724 such that the voltage is delivered to memory cells 732, 734 from the top. In other words, the boost voltage, SUPB, is provided to memory cell 732 before memory cell 734. Write decoder 726 and write drivers 722, 724 can be included with the local I/O 720. The data can be written to any of the memory cells 712, 714 of memory array 710 and/or memory cells 732, 734 of memory array 730 as described in detail in FIG. 5. Edge cells 750, 760 surrounding the top memory array 710 and bottom memory array 730 are used for power routing and/or power management signals. Each of the memory cells 712, 714, 732, 734 can be an SRAM cell having any number of transistors (e.g., 6T, 7T, 8T, 9T, 10T, etc.).

Figure 8:
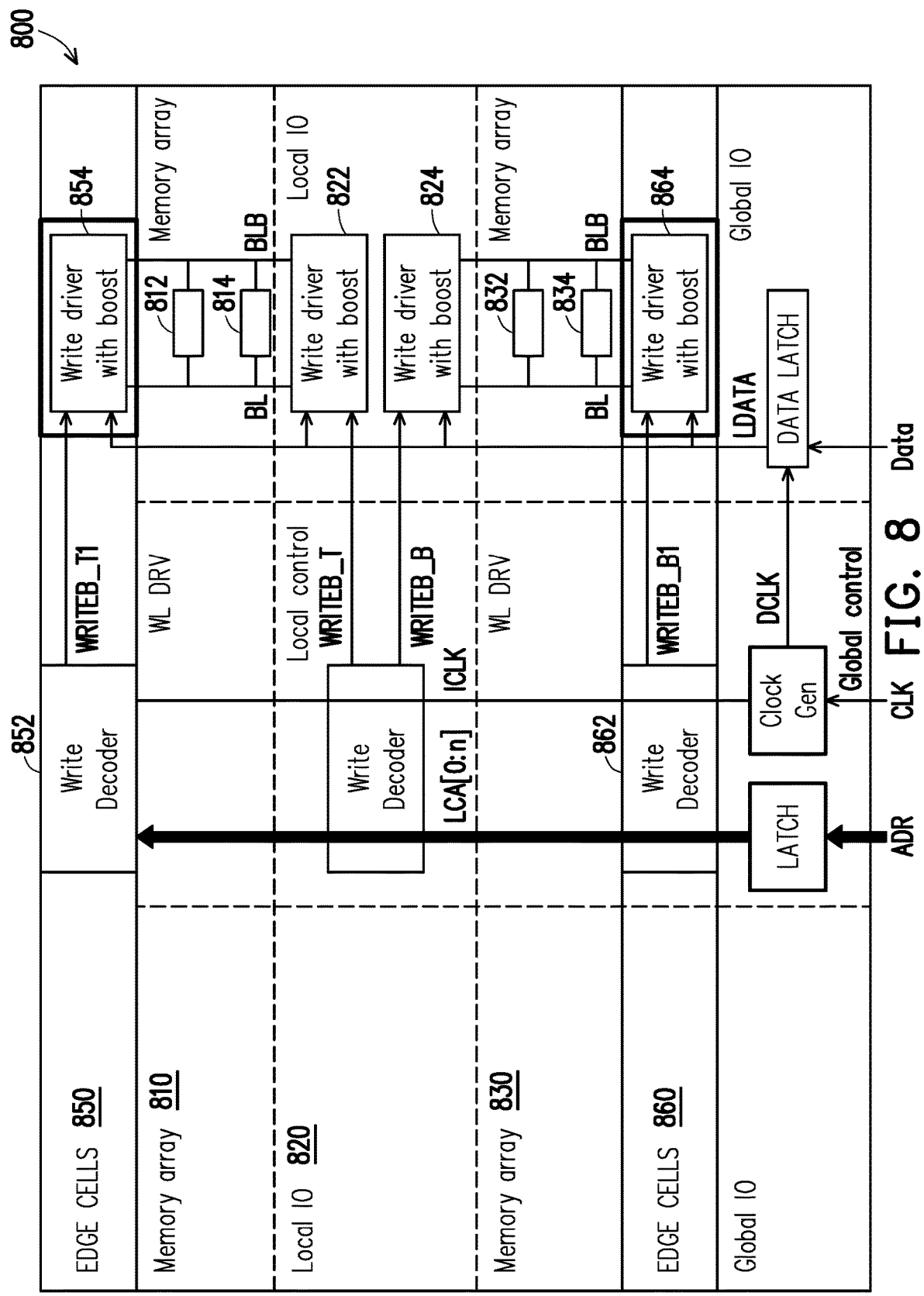
FIG. 8 illustrates another exemplary memory architecture having boost circuits in edge cells in accordance with various embodiments of the present disclosure.

FIG. 8 illustrates another exemplary memory architecture 800 having boost circuits within edge cells in accordance with various embodiments of the present disclosure. In the embodiment illustrated in FIG. 8, write drivers 822, 824 of local I/O 820 are not coupled to boost circuits. Instead, memory architecture 800 includes a write decoder 852 within edge cells 850 and write decoder 862 within edge cells 860. Each write decoder 852, 862 is coupled to a corresponding write driver coupled to a boost circuit 854, 864, respectively. Memory cells 812, 814 of memory array 810 receive the boost voltage, SUPB, from write driver with boost 854 positioned above the memory cells 812, 814. In this embodiment, memory cell 812 receives the boost voltage, SUPB, before memory cell 814. Similarly, memory cells 832, 834 receive the boost voltage, SUPB, from the write driver with boost 864 positioned beneath the cells 832, 834 such that the memory cell 834 receives the boost voltage, SUPB, prior to memory cell 832. Each of the memory cells 812, 814, 832, 834 can be an SRAM cell having any number of transistors (e.g., 6T, 7T, 8T, 9T, 10T, etc.).

Figure 9:
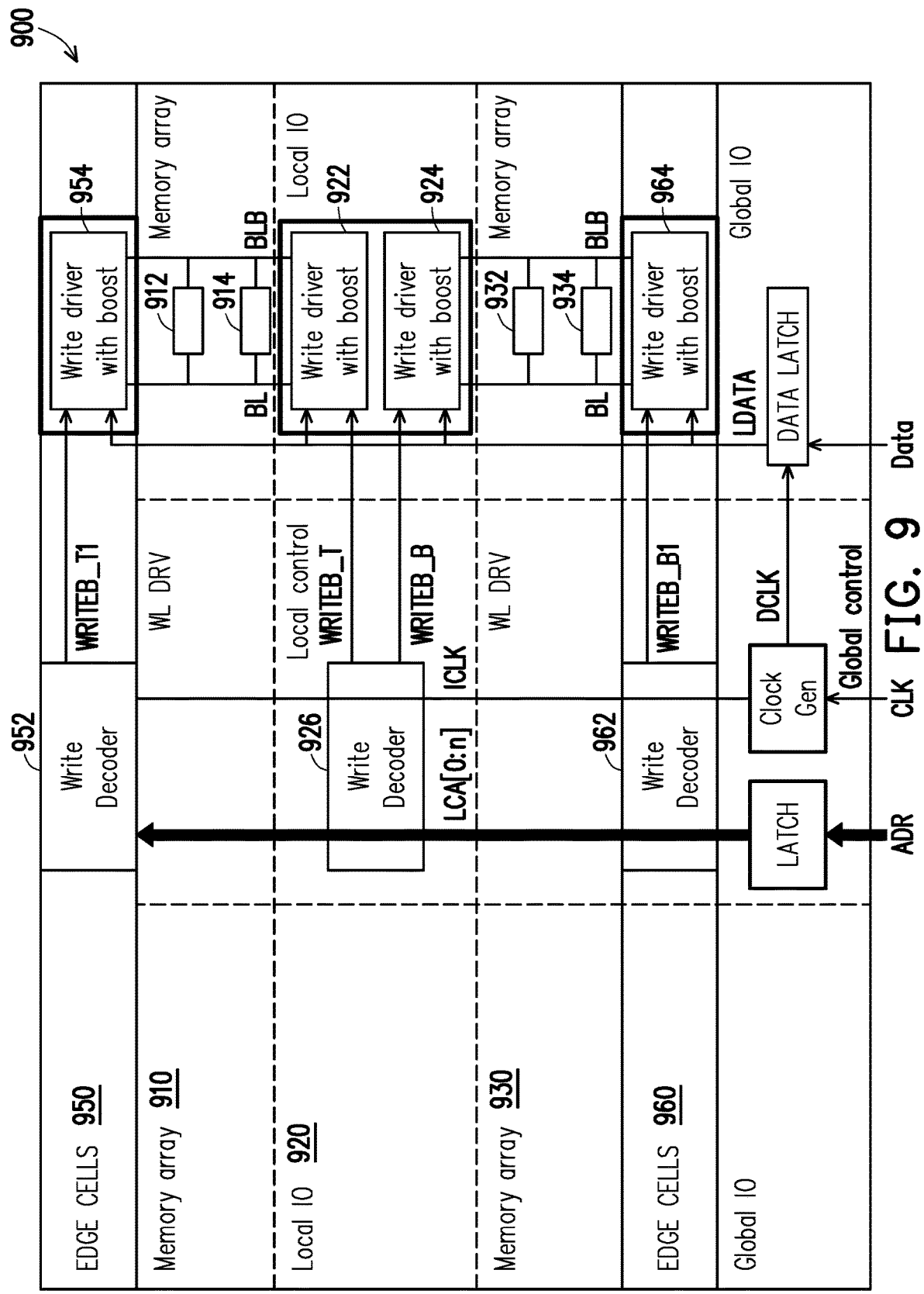
FIG. 9 illustrates another exemplary memory architecture having boost circuits in both edge cells and local input/output in accordance with various embodiments of the present disclosure.

FIG. 9 illustrates another exemplary memory architecture 900 having boost circuits in edge cells and local I/O in accordance with various embodiments of the present disclosure. In this embodiment, memory architecture 900 includes write drivers coupled to boost circuits in both the local I/O 920 and edge cells 950, 960. Memory cells 912, 914 of memory array 910 receive boost voltages, SUPB, from both write driver with boost 954, 922, based on the output of the NOR gates 422, 424 being a logic high (e.g., '1'). Memory cells 932, 934 of memory array 930 receive boost voltages, SUPB, from both write driver with boost 924, 964. Each of the memory cells 912, 914, 932, 934 can be an SRAM cell having any number of transistors (e.g., 6T, 7T, 8T, 9T, 10T, etc.).

Figure 10:
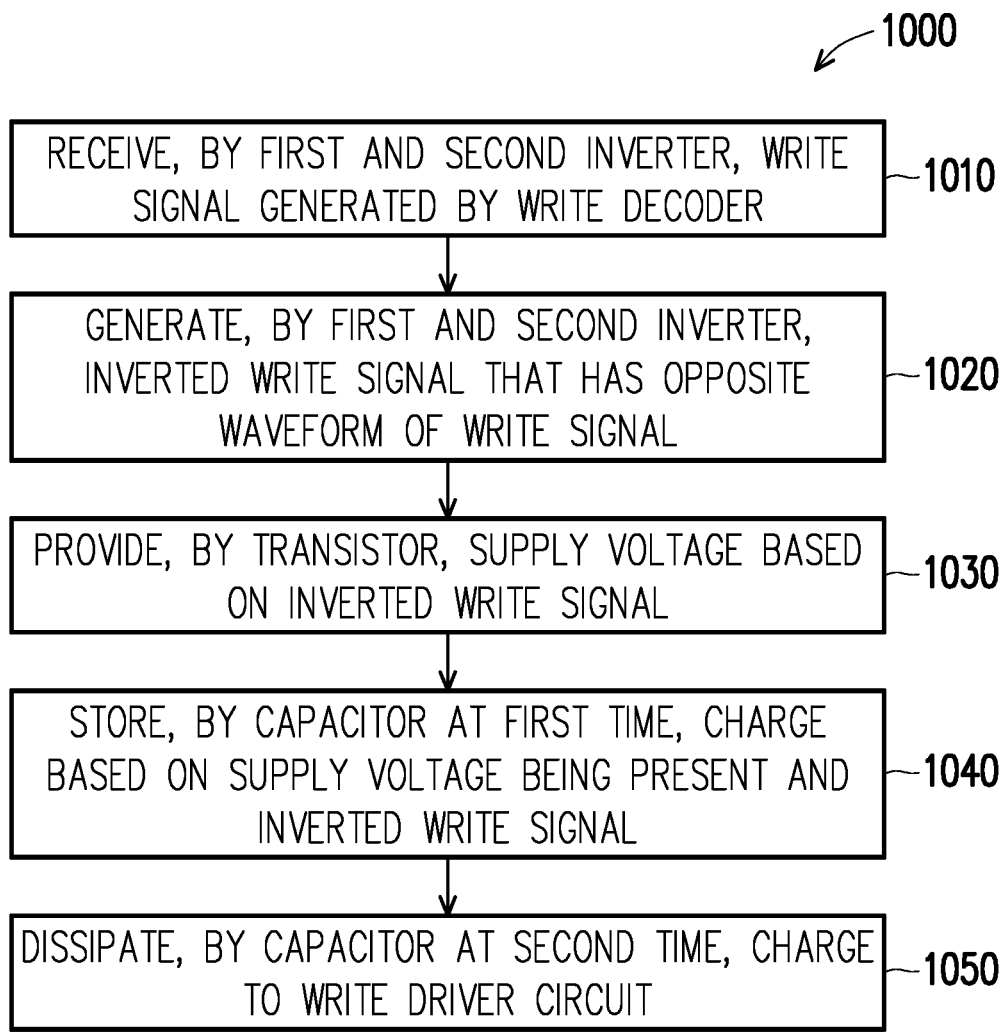
FIG. 10 illustrates an exemplary flow diagram of generating a boost voltage to enable a write operation of a memory cell in accordance with various embodiments of the present disclosure.

FIG. 10 illustrates an exemplary flow diagram 1000 process for generating a boost voltage to enable a write operation of a memory cell in accordance with various embodiments of the present disclosure. For ease in understanding, the process is described with reference to structures described previously herein. But it is understood that the process applies to many other structures as well. A first inverter (e.g., inverter 234) and a second inverter (e.g., inverter 232) receive a write signal (e.g., WRITEB) generated by a write decoder circuit (e.g., write decoders 726, 852, 862, 926, 952, 962) (e.g., step 1010). The first inverter (e.g., inverter 234) and the second inverter (e.g., inverter 232) each generate an inverted write signal (e.g., PB/PBC) that has an opposite waveform of the write signal (e.g., WRITEB) (e.g., step 1020). A transistor (e.g., transistor 238) is coupled to and provides a supply voltage, VSS, based on the inverted write signal (e.g., PB/PBC) (e.g., step 1030). A capacitor (e.g., capacitor 236) at a first time is charged based on the supply voltage (e.g., VSS) being present and the inverted write signal (e.g., PB/PBC) (e.g., step 1040). The capacitor (e.g., capacitor 236), at a second time dissipates the charge to a write driver circuit (e.g., write driver circuit 120) (e.g., step 1050). The boost voltage is the voltage across the capacitor (e.g., capacitor 236), which decreases over time as the capacitor 236 dissipates its charge.

Use of the various circuits and processes as described herein can provide a number of advantages. For example, use of the subject matter can overcome bit line resistance and facilitate a write operation. The boost voltage, SUPB, generated by the boost circuit 130 is provided to the write driver circuit 120. The write driver circuit 120 passes along this voltage to a bit line BL/BLB based on the comparison between the write decoder signal, WRITEB, and data signal, LDATA. With this boost voltage, the memory cell can have sufficient voltage to operate its components despite the bit line resistance and perform a write operation.

In one embodiment, a boost circuit configured to generate a boost voltage to enable a write operation of a memory cell includes a first inverter, a second inverter, a transistor, and a capacitor. The first inverter and the second inverter are each configured to invert a write signal. The transistor is coupled to an output of the first inverter. The transistor is configured to charge a capacitor based on the write signal and provide a supply voltage to a write driver. The capacitor is coupled to an output of the second inverter. The capacitor is configured to generate and provide a delta voltage to the write driver.

In another embodiment, a system for generating a boost voltage to enable a write operation of a memory cell includes a boost circuit, a write driver, and a memory cell. The boost circuit is configured to generate a boost voltage. The boost circuit includes a first inverter, a second inverter, a transistor, and a capacitor. The first inverter and the second inverter are each configured to invert a write signal. The transistor is coupled to an output of the first inverter. The transistor is configured to charge a capacitor based on the write signal and provide a supply voltage to a write driver. The capacitor is coupled to an output of the second inverter. The capacitor is configured to generate and provide a delta voltage to the write driver. The write driver is coupled to the boost circuit and is configured to provide a combination of the supply voltage and the delta voltage to the memory cell coupled to the write driver based on the write signal. The memory cell is configured to execute a write operation using the combination of the supply voltage and the delta voltage.

In yet another embodiment, a method of generating a boost voltage to enable a write operation of a memory cell. The method includes receiving, by a first inverter and a second inverter, a write signal generated by a write decoder circuit. The first inverter and a second inverter generates an inverted write signal that has an opposite waveform of the write signal. A transistor provides a supply voltage based on the inverted write signal. The capacitor, at a first time, stores a charge based on the supply voltage being present and the inverted write signal. The capacitor, at a second time, dissipates the charge to a write driver circuit. The boost voltage includes the dissipated charge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A boost circuit configured to generate a boost voltage to enable a write operation of a memory cell, the boost circuit comprising:
   a first inverter and a second inverter, each configured to invert a write signal;
   a transistor coupled to an output of the first inverter, the transistor configured to charge a capacitor based on the write signal and provide a supply voltage to a write driver; and
   the capacitor coupled to an output of the second inverter, the capacitor configured to generate and provide a delta voltage to the write driver,
   wherein the write driver comprises a pair of logic gates coupled together in parallel and each logic gate of the pair of logic gates receives a combination of the supply voltage and the delta voltage when the capacitor discharges.

2. The boost circuit of claim 1, wherein the write driver is further configured to provide the combination of the supply voltage and the delta voltage to a memory cell coupled to the write driver.

3. The boost circuit of claim 1, wherein the transistor is further configured to charge the capacitor when the write signal is a logic high.

4. The boost circuit of claim 1, wherein the first inverter and the transistor are coupled together in series.

5. The boost circuit of claim 1, wherein the second inverter and the capacitor are coupled together in series.

6. The boost circuit of claim 1, wherein the first inverter and the transistor are coupled to the second inverter and the capacitor.

7. A system for generating a boost voltage to enable a write operation of a memory cell, the system comprising:
   a boost circuit configured to generate a boost voltage, the boost circuit comprising:
      a first inverter and a second inverter, each configured to invert a write signal;
      a transistor coupled to an output of the first inverter, the transistor configured to charge a capacitor based on the write signal and provide a supply voltage to a write driver; and
      a capacitor coupled to an output of the second inverter, the capacitor configured to generate and provide a delta voltage to the write driver;
   the write driver coupled to the boost circuit configured to provide a combination of the supply voltage and the delta voltage to a memory cell coupled to the write driver based on the write signal; and
   the memory cell configured to execute a write operation using the combination of the supply voltage and the delta voltage,
   wherein the write driver comprises a pair of logic gates coupled together and each logic gate of the pair of logic gates receives a combination of the supply voltage and the delta voltage when the capacitor discharges.

8. The system of claim 7, wherein the write driver is further configured to provide the combination of the supply voltage and the delta voltage to a memory cell coupled to the write driver.

9. The system of claim 7, wherein the transistor is further configured to charge the capacitor when the write signal is a logic high.

10. The system of claim 7, wherein the first inverter and the transistor are coupled together in series.

11. The system of claim 7, wherein the second inverter and the capacitor are coupled together in series.

12. The system of claim 7, wherein the first inverter and the transistor are coupled to the second inverter and the capacitor.

13. The system of claim 7, wherein the memory cell comprises a sense amplifier coupled to the write driver circuit.

14. The system of claim 13, wherein the sense amplifier determines which bit line of the memory cell to write to for the write operation.

15. A method of generating a boost voltage to enable a write operation of a memory cell, the method comprising:
   receiving, by a first inverter and a second inverter, a write signal generated by a write decoder circuit;
   generating, by the first inverter and a second inverter, an inverted write signal that has an opposite waveform of the write signal;
   providing, by a transistor, a supply voltage based on the inverted write signal;
   storing, by a capacitor at a first time, a charge based on the supply voltage being present and the inverted write signal; and
   dissipating, by the capacitor at a second time, the charge to a write driver circuit, wherein the boost voltage comprises the dissipated charge.

16. The method of claim 15, further comprising providing, by the write driver circuit, the boost voltage to a memory cell, wherein the boost voltage comprises a combination of the dissipated charge and the supply voltage.

17. The method of claim 16, further comprising performing, by the memory cell, a write operation based on the boost voltage.

18. The method of claim 15, further comprising:
   comparing, by the write driver circuit, the write signal with a data signal; and
   determining, by the write driver circuit, which bit line of a pair of bit lines to provide the boost voltage.

19. The method of claim 15, wherein the write driver comprises a pair of logic gates coupled together and each logic gate of the pair of logic gates receives a combination of the supply voltage and the delta voltage when the capacitor discharges.

20. The method of claim 15, wherein a boost circuit comprises (i) a first inverter and a transistor coupled together in series and (ii) a second inverter and a capacitor coupled together in series, and wherein the first inverter and the transistor are coupled to the second inverter and the capacitor.

* * * * *